United States Patent [19]

Blass et al.

[11] Patent Number: 4,691,163

[45] Date of Patent: Sep. 1, 1987

[54] DUAL FREQUENCY SURFACE PROBES

[75] Inventors: Judd Blass; Hanan Keren, both of Haifa, Israel

[73] Assignee: Elscint Ltd., Haifa, Israel

[21] Appl. No.: 713,689

[22] Filed: Mar. 19, 1985

[51] Int. Cl.⁴ ............................................. G01R 33/08
[52] U.S. Cl. .................................. 324/318; 324/309; 128/653
[58] Field of Search ........................ 324/307, 309–310, 324/313, 318, 322; 128/653

[56] References Cited

U.S. PATENT DOCUMENTS

| 4,075,552 | 2/1978 | Troficante et al. | 324/322 |
| 4,446,431 | 5/1984 | McKay | 324/322 |
| 4,450,408 | 5/1984 | Tiemann | 324/322 X |

FOREIGN PATENT DOCUMENTS 1073652  2/1984  U.S.S.R. .............................. 324/307

Primary Examiner—Michael J. Tokar
Assistant Examiner—Francis J. Jaworski
Attorney, Agent, or Firm—Sandler & Greenblum

[57] ABSTRACT

A radio frequency surface probe for data acquisition in magnetic resonance systems. The probe is comprised of a plurality of inductors connected together with tuning capacitors in a balanced configuration. The configuration enables the probe to be impedance matched and to resonate at two separate frequencies without having to be tuned between frequency settings and without being effected by the impedance variations that are caused by the different samples or patients.

14 Claims, 9 Drawing Figures

DUAL FREQUENCY SURFACE PROBES

FIELD OF THE INVENTION

This invention is concerned with radio frequency coils or probes and more particularly with such probes used in magnetic resonance (MR) data acquisition systems.

BACKGROUND OF THE INVENTION

This invention is related to an earlier invention of the same inventors entitled "Multiple Feed RF Coils" and assigned to the assignee of this invention. The prior invention was filed in the U.S. on Nov. 7, 1984 and received Ser. No. 668,944, and which issued as U.S. Pat. No. 4,613,837 on Sept. 23, 1986.

In MR data acquisition systems, radio frequency (RF) coils are used to transmit RF signals which nutate nuclei that have been aligned by static magnetic fields. After the RF signals are removed, the nutated nuclei subsequently return to their former aligned positions. During this return, free induction decay (FID) signals are generated. These signals are detected by RF coils and provide data used to generate display images, for example. The most commonly nutated element in magnetic resonance imaging (MRI) is hydrogen. Other elements are also nutated, such as, for example, sodium. Also for a long time it has been known that phosphate can provide unique information. Thus, phosphate has been nutated to obtain MR spectroscopic data. For example, it is known that there is an abnormal abundance of phosphate in tissue that is tumorous. Accordingly, during some MRI procedures it is useful to obtain MR data based on the nutation of phosphor in the patient.

Surface coils are special RF probes that are designed to operate when juxtaposed to a portion of the patient. The proximity improves the effect of the RF signal. For example, surface coils are used to obtain images of a female patient's breast using the nutation of hydrogen nuclei. By using another frequency, the phosphor nuclei are nutated and spectroscopic data is obtained showing whether there is an abnormal accumulation of phosphor in the breast. If such an accumulation is found it is a reliable, early indication that a cancerous condition exists. This indication is obtainable long before other known tests for cancer can provide reliable data. The early detection of cancer is necessary for effecting a cure. Thus, it is extremely important to obtain such information as soon as possible.

In the past, it has been the practice to first obtain the MRI data using one RF surface coil or probe tuned for the Larmor frequency of hydrogen and subsequently obtaining phosphor spectrometric data using another RF probe tuned for the Larmor frequency of phosphor. The different coils were used since different frequencies are necessary to obtain the nutation of the different nuclei. It has not been common to use the same coil for the different frequencies because, among other things, of the difficulties in matching the impedance of the same probe to the characteristic impedances of the generator and receiver at two different frequencies.

However, the use of the same coil has indeed been suggested for radio frequency probes operating at different frequencies in nuclear magnetic resonance. For example, the U.S. Pat. No. 4,446,431 teaches a single coil for use at two frequencies. The tuning is accomplished remotely by using a transmission line wherein the high frequency signal is coupled at one point and the low frequency signal is coupled at another point on the transmission line.

The junction point for the low frequency signal in the single sample coil of the patent is extremely critical, as is the transmission line length. Another drawback of the double tuned single coil probe of the noted patent is that it has to be separately tuned for each sample being nutated. When the probe is used for acquiring data of inanimate objects this presents more of an inconvenience than a problem. The inconvenience is largely due to the increase in throughput time. However, when the sample is a human being then the retuning for each patient is not only time consuming for the clinic which decreases throughput, but is also time consuming for the patient and detrimental to the patient's comfort.

The prior art also teaches the use of wide band probe arrangements for MR spectrometers. See for example U.S. Pat. Nos. 4,075,552 and 4,129,822. Both patents teach tunable tank circuits that are individually tuned to determine the MR frequencies of samples. The coil, and associated circuitry are designed to match the impedances of both the transmitter and receiver at a wide range of frequencies. The '552 patent uses an auto-transformer as the inductance of the tank circuit while the '822 patent uses a plurality of directly connected coils, in a series parallel arrangement with a switching arrangements for inserting and removing a coil for different frequency ranges.

The noted prior art, in effect, teaches single coils or directly coupled coils with the resonant frequency being varied by variable capacitors, inductors or combinations thereof. Hence with the prior art devices it is necessary to tune the circuit each time the frequency is changed from high to low or vice-versa and/or either single or unbalanced coils are used in the RF probes. With probes made with unbalanced coils it is necessary to tune the probe for each patient. Periodic tuning operations are not sufficient to set the tuning for a plurality of specimens of samples (patients).

Accordingly, there is a need for surface probes for use in MR operations that can be used at a plurality of frequencies without requiring separate tuning for each of the frequencies and wherein the tuning is not a function of the impedance of the sample being probed. Therefore, it is an object of the present invention to provide radio frequency balanced probes for magnetic resonance operations which are tuned to a plurality of frequencies so that the probe can be used for acquiring MR data of different elements (hydrogen, sodium and/or phosphor nuclei, for example) without the necessity of removing and/or retuning the probes between the uses of the different frequencies. Ideally the RF probes provided also will not require tuning when used on different patients.

A balanced probe is defined herein as one in which "virtual" short circuit planes are produced by means of excitation of equal amplitudes and opposite polarities at an even number of feed points symmetrically spaced apart from each other. The balanced probes have equal potentials at opposite points on the circuits and thus the opposite points of the circuit can be considered interconnected or short circuited.

BRIEF DESCRIPTION OF THE INVENTION

In accordance with the present invention a radio frequency (RF) multiple coil, surface probe for magnetic resonance (MR) data acquisition is provided, said probe comprising:
- a plurality of inductors,
- means for connecting said plurality of inductors in a balanced circuit,
- a first connecting means for connecting a first frequency signal between a first pair of terminals with one of each of said first pair of terminals located at first opposite corners of said balanced circuit,
- second connecting means for connecting a second frequency signal to a second pair of terminals with one of each of said second pair of terminals located at second opposite corners of said balanced circuit;
- means for resonating said inductors at said first frequency,
- said second means including means for causing said inductors to resonate at said second frequency, and
- said balanced circuit with said first and second connecting means presenting a characteristic impedance at both said first an second frequencies.

A feature of the present invention provides radio frequency probes for magnetic resonance operations that are tuned to at least two frequencies and that are substantially independent of the impedance of the samples being nutated.

A related feature of the present invention comprises the same means for connecting both said first and second frequency signals to the same single pair of terminals on the balanced circuit.

BRIEF DESCRIPTION OF THE DRAWINGS

The above mentioned and other features and objects of the present invention will become more apparent by referring to the following description of broad aspects of the present invention taken in conjunction with the accompanying drawings, wherein:

FIG. 3b is a schematic of one quadrant of the balanced RF probe of FIG. 3a;

FIG. 7b is a schematic showing of one quadrant of the probe of FIG. 7a.

GENERAL DESCRIPTION

Figure 1:
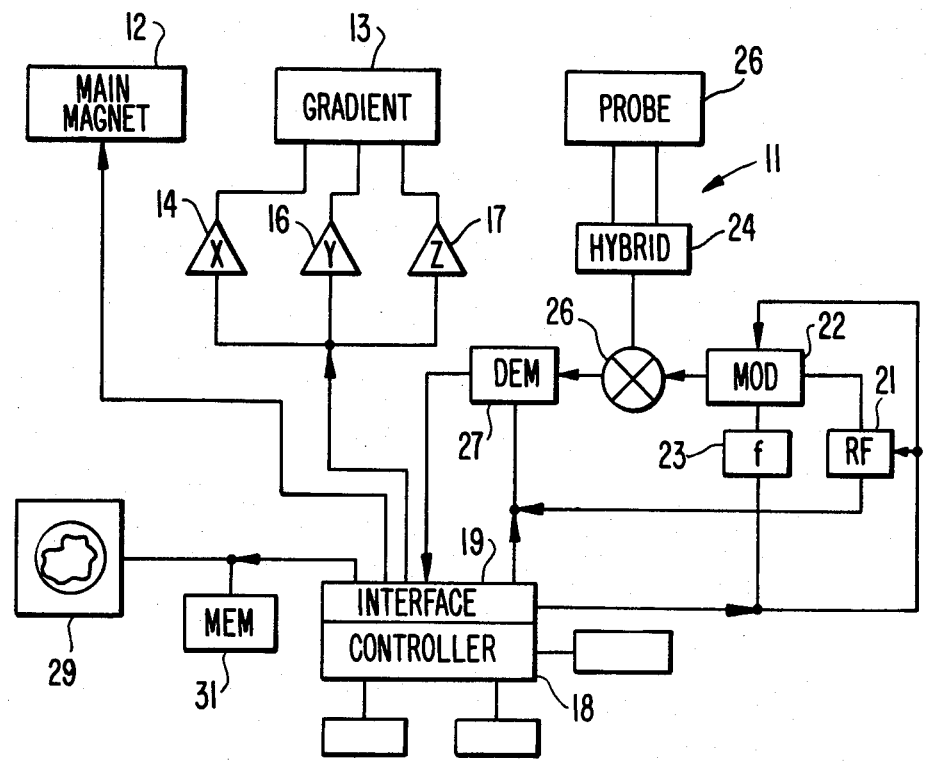
FIG. 1 is a block diagram showing of a magnetic resonance system connectable either in the receiving or the transmitting mode.

FIG. 1 at 11 shows an MR system which may be used for MR spectrometry and/or for MRI data acquisition purposes. Therein is shown the main magnet 12, which provides the static magnetic field that causes the nuclei being examined to assume an aligned state. Gradient magnets are indicated at 13. The gradient magnets are driven by the X gradient amplifier 14, the Y gradient amplifier 16, and the Z gradient amplifier 17, under the control of controller 18 operating through interface network 19, for example.

The gradients, as is well known, are used to select the plane to be imaged. With the gradients selectively energized, a radio frequency probe is pulsed to nutate the nuclei of the desired element. This is accomplished by using a radio frequency pulse of a given frequency according to the Larmor relationship. For example, to nutate hydrogen elements a frequency of 42.5M hertz is used in a one Tesla field. An RF generator 21 operates at the selected frequency. Its output is supplied to a modulator 22 which is also operated on by a function generator 23 to provide a shaped RF pulse, that is transmitted through a switching means 24 to RF probe 26.

The same probe may be used to detect the FID signals. The detected signals are transferred by a hybrid circuit 24 and through the switching means 26 to a demodulating circuit 27. The demodulating circuit has another input from the RF generator 21. The signal output of the demodulator is coupled to the controller where the signal is used as data for imaging purposes or for spectrometry purposes. The imaging data is used to form an image for display purposes on display circuit 29 in combination with the memory means 31.

If additional data is wanted for example if sodium nuclei or phosphate nuclei are to be nutated then different radio frequencies must be used in accordance with the well known Larmor relationship.

Figure 2:
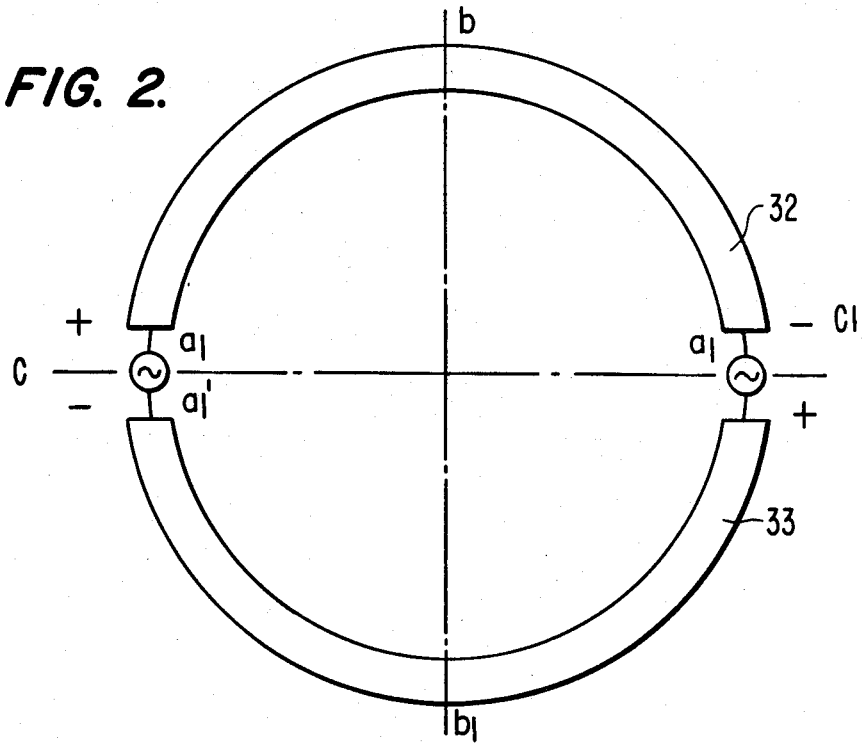
FIG. 2 is a sample balanced probe to aid in defining the phase balanced probe.

FIG. 2 is used to demonstrate balanced coils or probes which are used to diminish the effect of the specimens or samples on the resonant frequency and the characteristic impedance. For practical purposes to use the same probe for two different resonant frequencies it is important that the probes resonate at both desired frequencies and also have matching impedances at both frequencies. In FIG. 2 tuned circuits 32 and 33 are each excited at junctions a and a1 with opposite polarity. Short circuit planes are shown by way of example at bb1 and cc1. There can be no electric field parallel to these planes. Therefore when the balanced probe of FIG. 2 is used with a specimen the electric field coupling to the specimen is reduced which reduces the electrical losses.

Figure 3A:
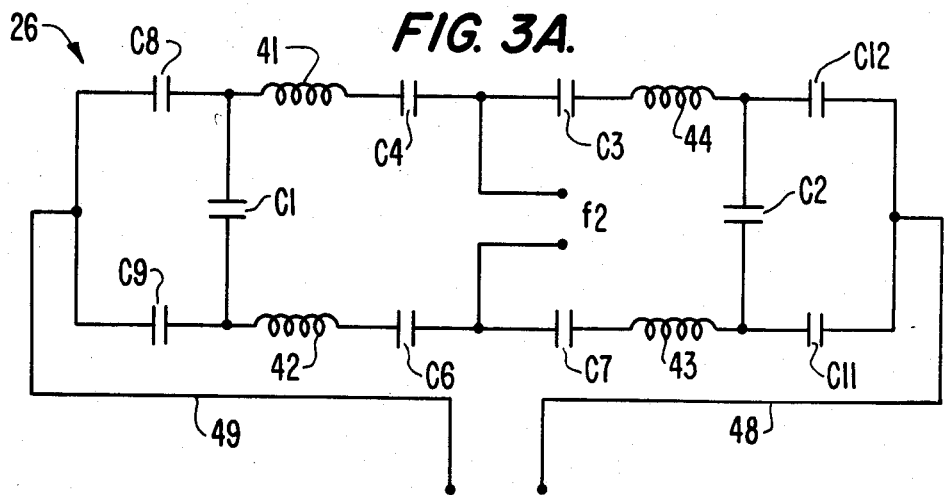
FIG. 3a is a schematic of a multiple coil balanced RF probe which resonates at a plurality of different radio frequencies.

FIG. 3a demonstrates how a plurality of coils used in the RF probe are connected to enable transmitting and receiving the different frequencies necessary to gather data on both hydrogen nuclei and phosphor nuclei for example, or more generally to enable acquiring data at different frequencies.

Figure 3B:
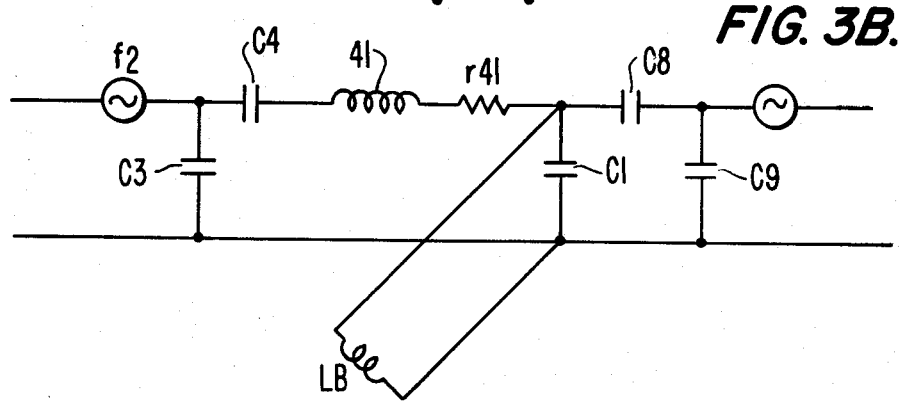
Figure 5:
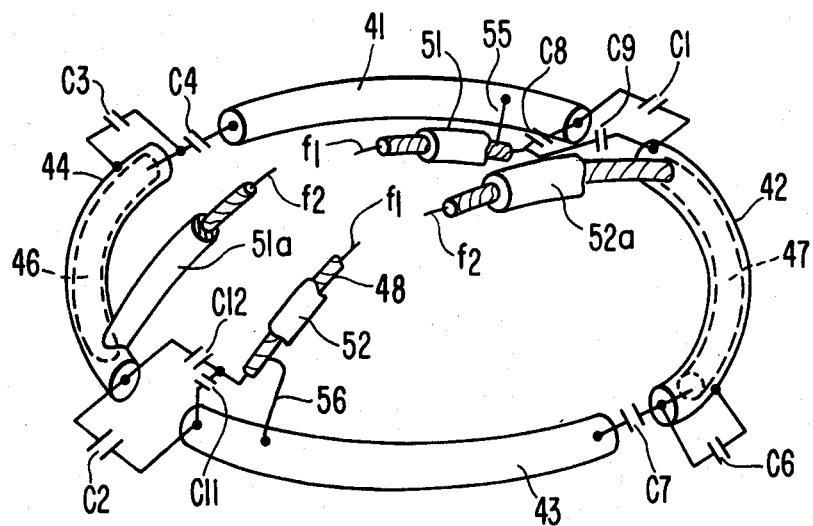
FIG. 5 is a pictorial showing of an embodiment of the probe of FIG. 3.

The probe shown in FIGS. 3a, 3b and 5 is a balanced double feed probe which resonates at two frequencies. Actually since two virtual short circuit planes are generated by the arrangement it is only necessary to show one quadrant as in FIG. 3b to illustrate the circuit. It also should be recognized that the impedance of the full four quadrant probe is equal to the impedance of a single quadrant since two quadrants are in series and the two series quadrants are in parallel.

A preferred embodiment of a probe used for imaging breasts is shown pictorially in FIG. 5. The "coils" include flat copper conductors 3.5 mm in width and 2 mm thick.

As shown in FIGS. 3a, 3b and 5 the RF probe 26 comprises four "coils" or inductors 41, 42 43 and 44. The "coils" are interconnected using capacitors. Thus, for example, "coils" 41 and 42 are interconnected by capacitor C1, while "coils" 43 and 44 are interconnected by capacitor C2. "Coils" 41 and 44 are interconnected by capacitors C3 and C4. "Coils" 42 and 43 are interconnected by capacitors C6 and C7.

A first frequency f1, preferably the high frequency, is applied to "coils 41 and 42 from shielded cable 48 through capacitors C8 and C9, respectively; and from shielded cable 49 through capacitors C11 and C12 to "coils" 43 and 44, respectively. A second frequency f2, preferably a low frequency is supplied from the shielded cable 46 to the junction of capacitors C3 and C4 and from shielded cable 47 to the junction of capacitors C6 and C7. In a preferred embodiment 3.5 mm shielded cable was used.

The matched power (hybrid) divider 24 (FIG. 1) is connected to the receiving circuitry and the transmitting circuitry and more particularly to modulator 22 and demodulator 28, respectively through switch means 26. The hybrid enables receiving at the different frequencies at different times and frequencies under the control of the controller in a manner well known to those skilled in the art.

In a preferred embodiment the hybrid circuit comprises the hybrid arrangement disclosed in the noted patent application. Other arrangements could be used within the scope of this invention.

A unique feature of the invention is that the coil arrangement does not have to be retuned or separately tuned per patient because the balanced type arrangement of the coils is such that the variations in the R.F. load of the patient coupled to the probe are minimal. Thus, once the probe is set to resonate at selected frequencies it does so both in the transmitting and the receiving modes and with the desired characteristic matching impedance substantially independently of the impedance contributed by the patients.

FIG. 3b illustrates only a single quadrant. In FIG. 3a for the high frequency f1, "coils" 41 and 44 are in "series", as are coils 42 and 43. The two series sets are connected to the hybrid divider. Similarly inductors 41 and 42 are is series, as are 43 and 44, for the low frequency f2. These two series ensembles are connected in parallel fashion to the low frequency divider. Thus, the quadrant representation of the circuit is valid both on a symmetry basis and on the basis of impedance matching.

The quadrant shown in FIG. 3b is the quadrant showing inductor 41 coupled to the high frequency f1 through capacitor C8. The high frequency is coupled to the junction of capacitors C8 and C9. Capacitor C9 is coupled to the junction of capacitor C1 and r41, the resistance of inductor 41. An inductor LB which is the inductive loading of a BALUN is shown bridging C1.

The low frequency generator f2 is shown coupled to the junction of capacitors C3 and C4. Capacitor C4 is in series with the inductor 41.

Figure 6:
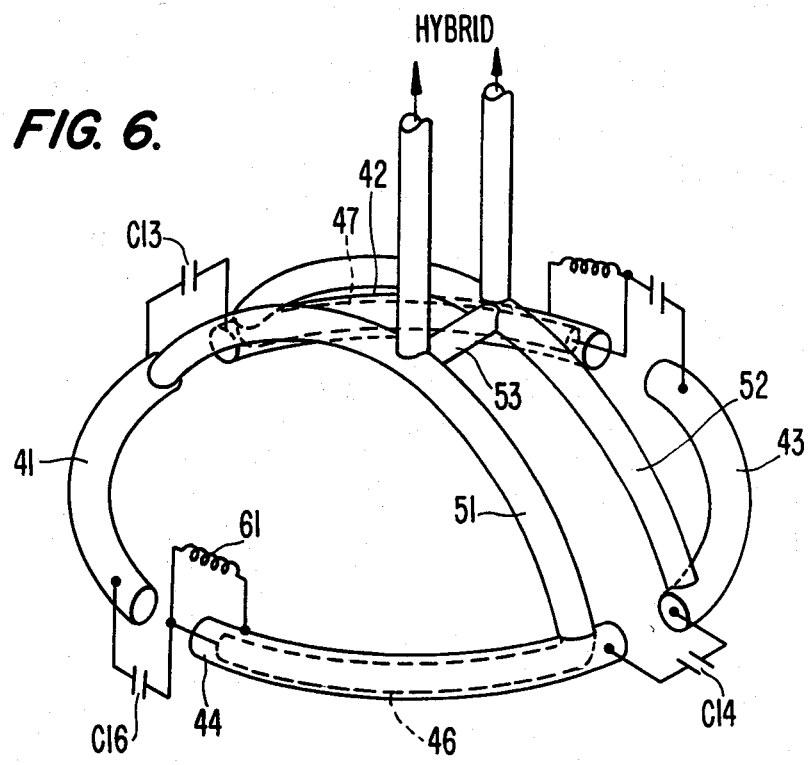
FIG. 6 is a pictorial showing of another embodiment of the inventive probe wherein both high and a low frequency signal are connected to the same points on the balanced circuit using only two conductors.

In order to isolate the input cables 46 and 47 from the probes, which is necessary for a balanced feed system, the cables are brought through the BALUN. The term BALUN refers to a "balanced-unbalance" means for introducing coaxial cable into a balanced probe or antenna. In this case the BALUN structure may comprise the copper tubes 51, 51a, 52 and 52a, (FIGS. 5 and 6).

Figure 4:
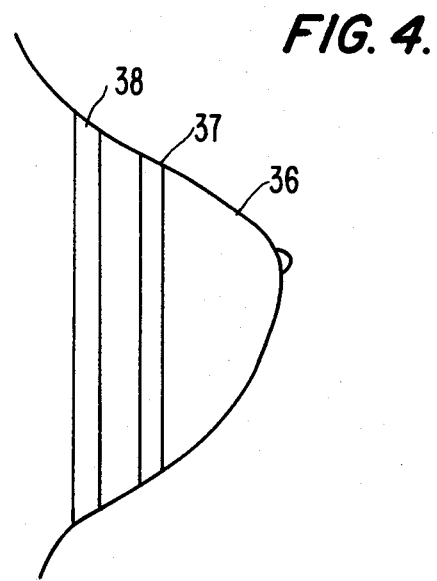
FIG. 4 is schematic showing of a womans breast with selected planes therein magnetically activated.

FIG. 4 is a schematic showing of a woman's breast 36. First and second planes imaged are shown at 37 and 38 respectively. The planes are selected by proper energization of the gradient coils in manner which is well known to those skilled in the art. An advantage of this invention is that if the plane shown at 37 is selected than the imaging data and the spectroscopic data can be acquired without having to move the probe or return the probe, this advantage enables the physician to more accurately correlate the image data and the spectrographic data as well as increasing patient throughput. For example, with the probe in place on the patient's breast, first RF signals are applied to nutate hydrogen nuclei. Data is acquired and without moving or returning the probe, second RF signals are applied such that the phosphate nuclei are nutated during the application of the gradient fields that were used for the imaging of plane 47. The same RF surface probe is used without moving or returning it both for the hydrogen and phosphor nuclei nutation. Thus, any phosphor build up is detected immediately and accurately located.

In the embodiment of FIG. 5, the shielded lead-in cables 48 and 49 for the frequency f1, and the shielded cables 46 and 47 are brought into proximity to the flat copper sections 41–44 through 8 mm copper tubing arcuately disposed above the flat copper sections. The arches formed by the copper tubing is illustrated for example in FIG. 6 and comprises the previously mentioned BALUN. More particularly as indicated in FIG. 5 shielded cables 48 and 49 pass through tubing 51 and 52 respectively. The shielded cables 46 and 47 are also located within tubing indicated as 51a and 52a respectively. The tubing 51 and 51a and the tubing 52 and 52a are each respectively one arch shaped tube with the cables entering at the apex and then going in opposite directions. The shielding of cables 48 and 49 are shorted to inductors 41 and 43 by short circuit connectors 55 and 56 resectively.

Figure 7A:
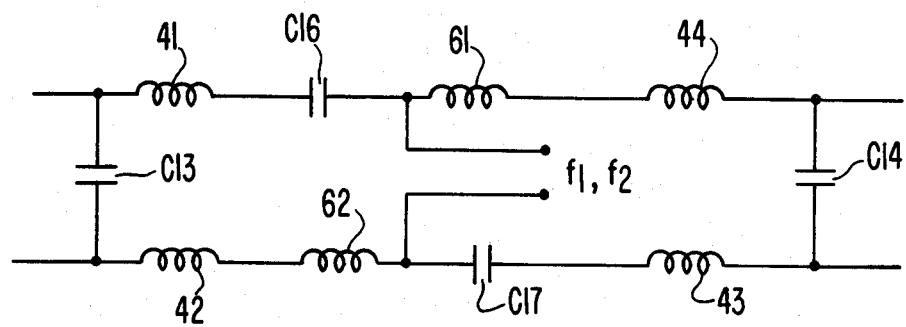
FIG. 7a is a schematic showing of the probe of FIG. 6.
Figure 7B:
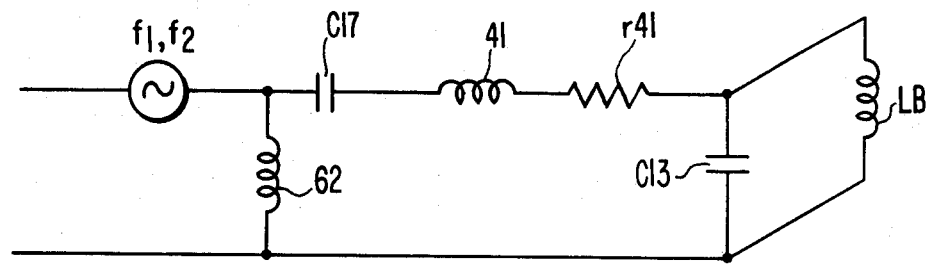

In another embodiment of the invention one pair of lead-in cables connect both the frequencies f1 and f2 to the coils of the unique balanced RF probes that are tuned and impedance matched at two frequencies. More particularly FIG. 6 pictorially shows the flat copper "coils" 41–44 and the shielded cable 46 and 47 that were shown in FIG. 5. The schematic of FIG. 6 is FIGS. 7a and 7b. The connections between the coils are somewhat changed from the embodiment of FIG. 3 and there are no separate lead-in cables for the f1 signal. Instead both the f1 and f2 signals are connected through the cables 46 and 47. The cables are shown passing through the arch shaped copper tubes 51 and 52. Note that for the embodiment of FIGS. 6 and 7 the copper tubes are shorted together at 53.

The symmetrical feed points for the one pair of lead-in cables are at the inner conductor connections of cables 46 and 47. These feed points are common for the high frequency f1 and the low frequency f2.

In order to operate at two frequencies, the probe has to satisfy the following four conditions:
(1) the probe is series resonated at frequency f1, i.e. the inductive and capacitive stored energies are equal at frequency f1;
(2) the stored energies are also equal at frequency f2;
(3) the impedance at the feed junction is resistive and equal to a characteristic impedance such as 50 Ohms at frequency f1;
(4) same as (3) at frequency f2.

In the case of the circuit for the double pair of lead-in cables, (FIG. 3) the four conditions are satisfied by two sets of capacitors; i.e. C8/C9 (and their identical mates C11/C12) and C7/C6 (with their identical mates C4/C3). Thus, (1)–(4) above can be expressed as four mathematical equations which are satisfied by the four capacitors C6–C9.

In the case of the one pair of lead-in cables (FIG. 7) the same four equations apply. The inductor 62 (and its identical mate 61) generate an inductive reactance which varies linearly with frequency; as opposed to capacitor C8 and C6 which generate a reactance which varies inversely with frequency. By using an inductive reactance instead of a capactive reactance, it is possible to satisfy the four circuit requirements (1)–(4) above with the only three variable parameters; i.e. inductor 62, capacitors C14, and C17 (with their corresponding identical mates). It is the use of this inductor that makes it possible to feed f1 and f2 at common points in the probe.

The reason for the independence of the probe tuning with specimen loading is due to the short circuit planes (surfaces) which are generated by the balanced or double symmetric feeders. Detuning in surface probes is due mainly to electric field coupling to the specimen. These short circuit surfaces inhibit such coupling.

In operation the balanced surface probe arrangement is used to accumulate data for imaging purposes at different frequencies to nutate nuclei of different elements. The arrangement is ideally suited to accumulate spectroscopic data of a first element in addition to acquiring imaging data of a second element. The use of the single probe for acquiring data at different frequencies without the necessity of moving or returning speeds up the magnetic resonance data acquisition to thereby minimize patient discomfort and to increase patient throughput.

In preferred embodiment the values of the inductors and capacitors are as follows:

| Inductors | Capacitors |
|---|---|
| 41,42,43,44  40 nH | C1 = C2 = 60 pF |
| 61,62  50 nH | C4 = C7 = 150 pF |
| | C6 = C3 = 500 pF |
| | C8 = C11 = 50 pF |
| | C9 = C12 = 20 pF |

The resistance r1 is 0.05 ohms.

While the invention has been explained using specific embodiments, it should be understood that these embodiments are described by way of example only and not as a limitation on the scope of the invention, which is defined by the accompanying claims.

What is claimed is:

1. A radio frequency (RF) surface probe for use in magnetic resonance (MR) systems with transmitter means for transmitting RF pulses which cause samples under test to emit RF signals and with receiver means for receiving said RF signals, the transmitter means and the receiver means having a characteristic impedance, said signals providing data for imaging and/or spectrograph purposes, said probe resonating at least at a first frequency and a second frequency, said probe comprising:
   (a) a plurality of inductance means for transmitting said RF pulses to said samples and for receiving said RF signals from said samples;
   (b) reactance means for connecting together said plurality of inductance means to form a balanced probe circuit having virtual short circuit planes that minimize electrostatic coupling between the probe and a given sample and thereby minimize loading of the probe by the given sample and enabling the probe to be used with different samples and/or spacing between the given sample and the probe without the necessity of retuning to maintain resonance at the first frequency and at the at least second frequency;
   (c) first connecting means for connecting said balanced probe circuit to said transmitter means and said receiver means and to cause said plurality of inductance means and said reactance means to match said characteristic impedance and to resonate at said first frequency; and
   (d) second connecting means for connecting said balanced probe circuit to said transmitter means and said receiver means and to cause said plurality of inductance means and reactance means to match said characteristic impedance and to resonate at said second frequency.

2. The RF surface probe of claim 1 wherein said plurality of inductance means comprises four inductors, each of said four inductors comprising a conductor spanning substantially a 90° arc.

3. The RF surface probe of claim 2 wherein said four conductors are arranged to form a loop.

4. The RF surface probe of claim 3 wherein said reactance means comprises capacitor means.

5. The surface RF probe of claim 4 wherein:
   (a) first and second inductors of said four inductors are connected together by said capacitor means comprising a first series pair of first and second capacitors bridged by a third capacitor, said third and fourth inductors of said four inductors being connected together by said capacitor means comprising a second series pair of fourth and fifth capacitors bridged by a sixth capacitor;
   (b) said first and fourth inductors of said four inductors being connected together by said capacitor means comprising a third series pair of seventh and eighth capacitors; and
   (c) said second and third inductors being connected together by said capacitor means comprising a fourth series pair of ninth and tenth capacitors.

6. The surface RF probe of claim 5 wherein:
   (a) said first connecting means comprises a lead connected to the junction of said first and second capacitors and a second lead connected to the junction of said fourth and fifth capacitors;
   (b) said second connecting means comprises a lead connected to the junction of said seventh and eighth capacitors and another lead connected to the junction of said ninth and tenth capacitors; and wherein
   (c) said first frequency signals are transmitted over said first connecting means and said second frequency signals are connected over said second connecting means.

7. The RF surface probe of claim 5 wherein said probe is balanced and symmetrical and wherein said first and second connecting means for connecting said balanced symmetrical probe comprise shielded cable means.

8. The RF surface probe of claim 7 wherein said shielded cable means comprises:
   (a) a first and a second set of shielded cables;
   (b) the first set of shielded cables comprising a first shielded cable connected to the junction of the first and second capacitors and a second shielded cable connected to the junction of the fourth and fifth capacitors;
   (c) said first and third inductors being first and third conductors oppositely disposed to each other in opposite quadrants of the loop;

(d) the second set of shielded cables having a first shielded cable attached to run along the second of the conductors of said four conductors and being connected to the junction of said seventh and eighth capacitors and a second shielded cable attached to run along the fourth of said conductors and being connected to the junction of said ninth and tenth capacitors; and (e) said second and fourth conductors being second and fourth inductors oppositely disposed in opposite quadrants of the loop and located between said first and third conductors forming said loop.

9. The RF surface probe of claim 8 wherein said conductors are flat copper conductors.

10. The RF surface probe of claim 9 wherein said conductors are arcuate and wherein said loop is substantially a circle on a plane.

11. The RF surface probe of claim 10 including copper tubing means, wherein said two sets of shielded cable pass through said copper tubing means prior to the connection to the capacitor means and said copper tubing means being fastened about said conductors.

12. The RF surface probe of claim 11 wherein said copper tubing means comprises a pair of arcuately shaped tubes which arch over to the center of the circle, said shielded cables going into said arcuately shaped copper tubing means at the apex of the arch above the center of circle on the plane.

13. The surface RF probe of claim 12 wherein said copper tubes are shorted together to form part of a balanced-unbalanced coupling circuit.

14. The RF surface probe of claim 5 wherein said reactance means comprises:

(a) an eleventh capacitor connecting said first and said second inductors;

(b) twelfth capacitor connecting said third and fourth inductors;

(c) a series combination of a thirteenth capacitor and a fifth inductor connecting said first and fourth inductors;

(d) a series combination of a fourteen capacitor and a sixth inductor connecting said second and third inductors;

(e) said first connecting means comprising a first shielded cable running along said second inductor said connected to the junction of said fourteenth capacitor and said sixth inductor; and (f) said second connecting means comprising a second shielded cable running along said fourth inductor and connected to the junction of said thirteenth capacitor and said fifth inductor.

* * * * *